United States Patent
Lynaugh (12)

(10) Patent No.: US 6,535,068 B1
(45) Date of Patent: Mar. 18, 2003

(54) SYSTEM AND METHOD FOR TEMPERATURE COMPENSATED IF AMPLIFIER

(75) Inventor: Kevin John Lynaugh, Carlsbad, CA (US)

(73) Assignee: Microtune (Texas), L.P., Plano, TX (US)

( * ) Notice: Subject to any disclaimer, the term of this patent is extended or adjusted under 35 U.S.C. 154(b) by 72 days.

(21) Appl. No.: 09/788,957

(22) Filed: Feb. 17, 2001

(51) Int. Cl.[7] .............................. H03F 3/04; H03G 9/00; H03G 3/10
(52) U.S. Cl. ........................ 330/289; 330/133; 330/134; 330/285
(58) Field of Search ................................ 330/133, 134, 330/285, 289

(56) References Cited

U.S. PATENT DOCUMENTS

| | | | | |
|---|---|---|---|---|
| 4,275,362 A | * | 6/1981 | Harford | ...................... 257/536 |
| 4,581,643 A | | 4/1986 | Carlson | |
| 4,726,072 A | | 2/1988 | Yamashita et al. | |
| 4,849,710 A | | 7/1989 | Vo | |
| 5,140,198 A | | 8/1992 | Atherly et al. | |
| 5,274,339 A | * | 12/1993 | Wideman et al. | ........... 330/277 |
| 5,339,046 A | | 8/1994 | Kornfeld et al. | |
| 5,375,146 A | * | 12/1994 | Chalmers | ..................... 375/344 |
| 5,570,065 A | * | 10/1996 | Eberhardt et al. | .......... 330/279 |
| 5,994,955 A | | 11/1999 | Birkeland | |
| 6,094,084 A | * | 7/2000 | Abou-Allam et al. | ....... 327/356 |
| 6,285,865 B1 | | 9/2001 | Vorenkamp et al. | |

OTHER PUBLICATIONS

Meyer, Robert G. "A 1–GHz BiCMOS RF Front–End IC." IEEE Journal of Solid–State Circuits; vol. 29 No. 3 (Mar. 1994): 350–355.
Kinget, Peter and Michiel Steyaert. "A 1 GHz CMOS Upconversion Mixer". IEEE Custom Integrated Circuits Conference. (1996) 197–200.
McGinn, Mike. "An Advanced I.F. Amplifier & AFT System Suitable for HDTV." IEEE Transactions on Consumer Electronics. vol. 36 No. 3 (Aug. 1990) 407–414.
Pratt, William J. "High Linearity HBT Amplifier Targets Multicarrier Systems" RF Design. (Mar. 1996). 47–54.
Giles, Martin. "The LM 1823: A High Quality TV Video I.F. Amplifier and Synchronous Detector for Cable Receivers." National Semiconductor Corporation. (Mar. 1985). 1–16.
MC44302: Advanced Multi–Standard TV Video/Sound IF. Motorola, Inc. (Jun. 17, 1994).
Kokozinski, Rainer, et al. "Microwave Wideband Amplifiers In Bulk–CMOS/SIMOX Technologies." IEEE International Solid–State Circuits Conference. (1995). 146–147; 188–189.

* cited by examiner

*Primary Examiner*—Patricia Nguyen
(74) *Attorney, Agent, or Firm*—Fulbright & Jaworski L.L.P.

(57) ABSTRACT

The gain characteristics of certain stages of a tuner circuit are selected to be proportional, but opposite, to selected other stages such that the overall gain of the tuner remains constant over a wide temperature range. In one embodiment, the gain of the IF stage has a temperature slope opposite to the temperature slope of the input RF stage thereby avoiding the use of AGC circuitry.

38 Claims, 2 Drawing Sheets

FIG. 3C $\left\{ \dfrac{dG}{dT} = \left( \dfrac{dGAIN(dB)}{dR_{BIAS}} \right) \left( \dfrac{dR_{BIAS}}{dT} \right) \right.$ FIG. 3D $\left\{ \begin{array}{l} \dfrac{dR}{dT} = \left( \dfrac{dGAIN}{dT} \right) \left( \dfrac{dR}{dGAIN} \right) \\ \dfrac{dR}{dT} = (0.059)(1180.5) = 69.65 \, \dfrac{\Omega}{°C} \end{array} \right.$

SYSTEM AND METHOD FOR TEMPERATURE COMPENSATED IF AMPLIFIER

TECHNICAL FIELD

This invention relates to single RF tuners and more particularly to a system and method for temperature compensation within single conversion tuners.

BACKGROUND

Single conversion tuner circuits are very prevalent. The first element in the frond end of the typical RF tuner is a dual gate FET amplifier. The inherent problem with these devices is that they are sensitive to temperature causing the signal level to change. Over an industrial temperature range of +85C to −40C, there is typically between 6 and 10 db of gain variation. One method of compensating for gain variation is to use automatic gain control (AGC) in a feed back manner. However, when gain is retarded, the noise level rises for this application by approximately between 6 and 8 db. For this application RF AGC is the only available method of retarding the system gain. As the temp goes down the RF gain goes up to counteract this action and the RF gain then needs to be reduced. Reducing the RF gain unfortunately increases the system noise figure, thereby decreasing the SNR out of the tuner. Thus, it is desired not to have to retard the RF gain setting. Also, it is desired to save the power of an AGC circuit which can be in the order of 40 mA, which does not seem like much, but when total available power is limited, and where the heat from excess power usage is important, 40 mA can be critical.

SUMMARY OF THE INVENTION

The present invention is directed to a system and method which takes advantage of the fact that the first stage dual gate in the RF input circuit of a tuner is actually quite well behaved in terms of its gain variation versus temperature. In fact, there is almost a linear degradation in gain as temperature increases. For example, assume that at −40C, the system gain is 40 dB. In this example, we found that gain would degrade to 32 dB with an almost linear slope at 85° C. Using this almost linear property, I have designed an IF stage which has an opposite slope as a function of temperature and which maintains the proper linearity over the gain variation.

The circuit and method of this invention implements a thermistor in the common emitter bias of an IF amplifier tailored to precisely pinch off the bias current to reduce the gain of the IF amplifier as a function of temperature. The characteristic of the IF amplifier is selected to be opposite of the gain of the input FET so that the two gain curves exactly cancel.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims. The novel features which are believed to be characteristic of the invention, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present invention.

BRIEF DESCRIPTION OF THE DRAWING

For a more complete understanding of the present invention, reference is now made to the following descriptions taken in conjunction with the accompanying drawing, in which:

FIGS. 3A–3D show how to derive the proper compensation parameters; and

DETAILED DESCRIPTION

Figure 4:
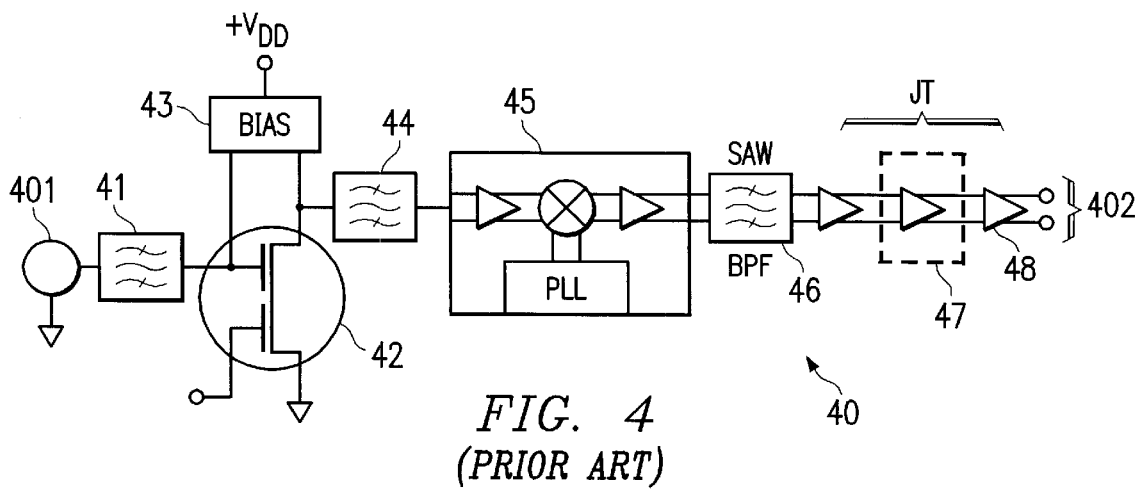
FIG. 4 shows a typical prior art circuit which requires some form of automatic gain control (not shown).

Prior to beginning a description of the invention, it might be helpful to understand a typical prior art circuit as shown in FIG. 4, where there is shown a standard configuration of a single conversion tuner 40. The RF input 401 goes to band pass filter 41. The RF which passes through filter 41 goes to the dual gate FET which is biased by element 43. The FET gate is normally used to control the gain of the entire system for a single gain type of design.

The RF then goes to band pass filter 44 which actually is a channel select filter. The signal then goes to PLL mixer oscillator 45 where a frequency translation to an IF frequency occurs. For example, an RF frequency of 500 MHZ could be input to the tuner. The local oscillator would be programmed to 544 MHZ and it would mix the input signal down to IF to frequency of 44 MHZ and then to saw filter 46 which selectively selects out the specific signal. The IF signal then goes to the IF amplifier stage, 46, 47 which amplifies the signal to output 402.

Figure 1:
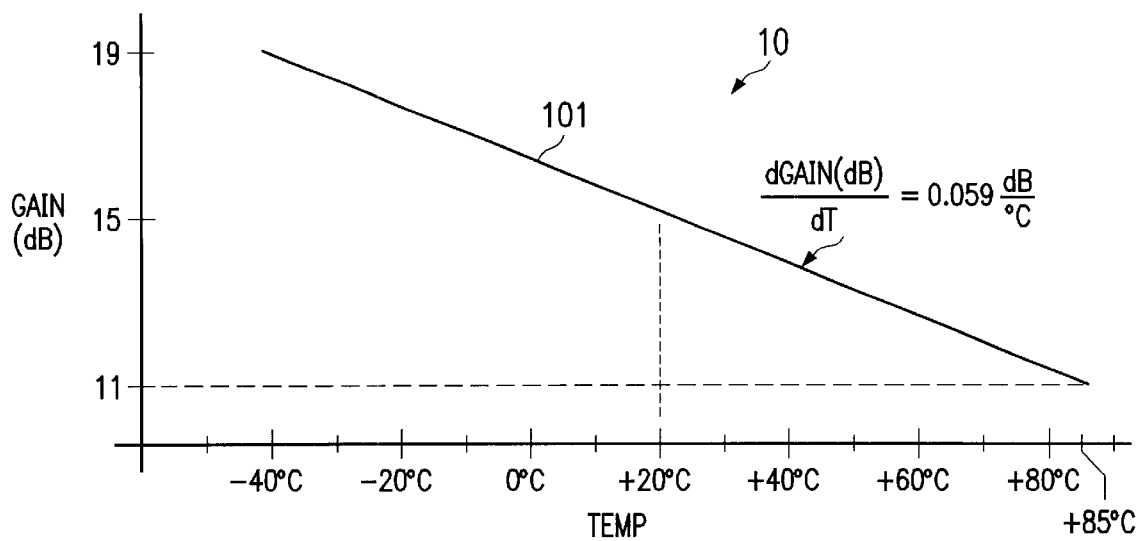
FIG. 1 shows the slope of the gain of the tuner input as a function of temperature.

Turning now to FIG. 1, as discussed above, the gain of the input of the tuner is almost inversely proportional to temperature as shown by line slope 101. The problem with this is if you have a fixed amount of input power on the front end, and the temperature varies, for example, if the temperature went very cold, you would have to reduce the gain by 4 db because the gain of the FET increases by that amount. When the 4 db of gain reduction is implemented (by an automatic gain control (AGC) circuit—not shown), the noise in the RF signal would be increased by 4 db, thereby changing the signal to noise ratio. For example, assume gain was 21 db at room temperature, it would become 25 db at the coldest temperature. This is a severe penalty considering the system requires a minimum 22 db of gain to operate. This means that the system would fail unless some type of compensation were to be used.

As will be seen, the inventive circuit adjusts the IF amplifier gain to compensate for the input gain change therefore does not require adjustment of the RF input gain to maintain proper output power. Essentially the inventive circuit is self-leveling over a particular temperature range so it maintains optimum noise performance of the system. This is accomplished by the circuit shown in FIG. 2.

Figure 2:
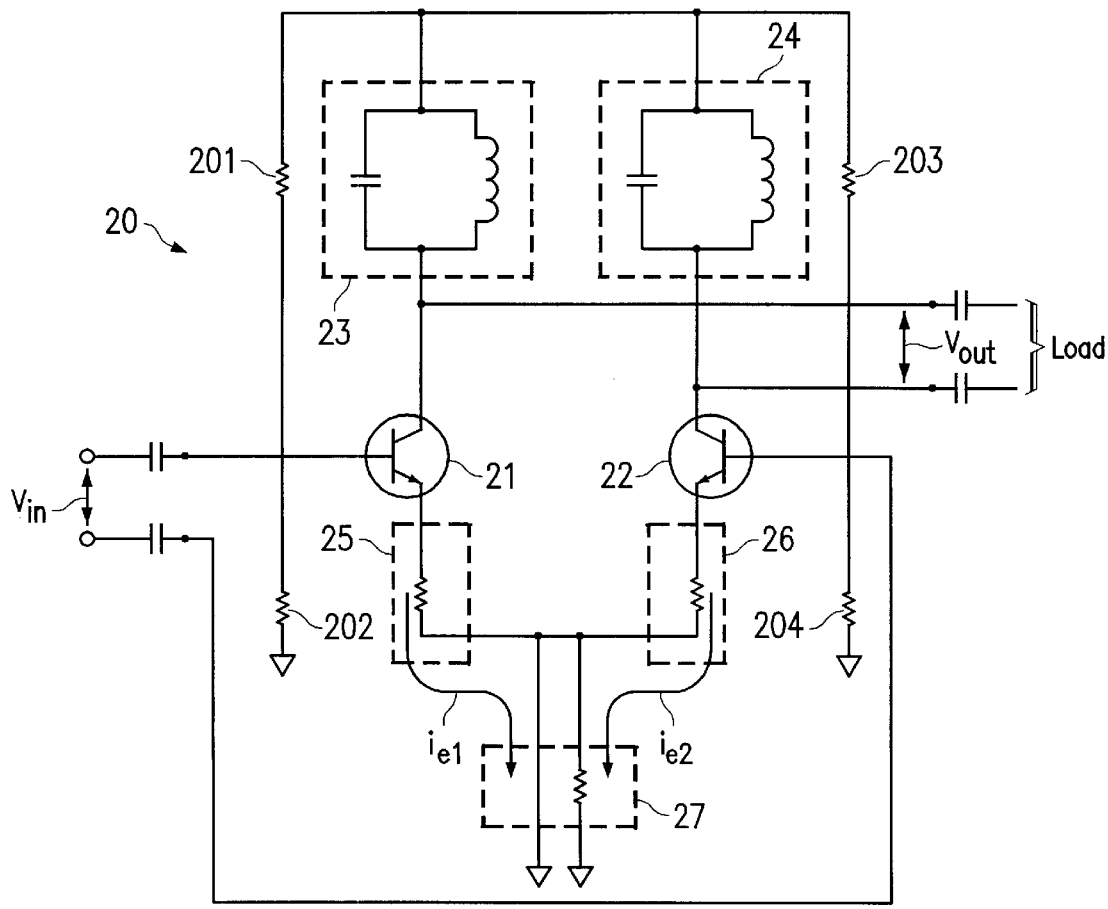
FIG. 2 shows one embodiment of a system and method for compensating for the input gain change as the temperature changes.

FIG. 2 is one illustrative implementation of IF amplifier 20 which implements the gain correction. This is accomplished by using thermistor 27 having a specified temperature sensitivity to it in the emitter resistor circuit. The selection of the proper transfer function of thermistor 27 is accomplished by measuring the gain of amplifier pair 21, 22 as a function of elements 25, 26, 27. Gain is measured between the input terminals and the output terminals. Then a thermistor is selected which tracks as close as possible the measured curve. The effect is to design a circuit which has a gain increase as a function of temperature which is the opposite slope of what the FET (in the input) is doing.

Circuit 20 is basically a differential common emitter. Transistors 21 and 22 form the amplifier and are driven 180 degrees out of phase and biased with a T-structure. This is done to stabilize the design over temperature between components and from unit to unit. The emitters of transistors 21, 22 are tied together to produce emitter degeneration in terms of the DC bias points. Thus, if the temperature goes up and the bias current were to increase, the emitter voltage would rise, but the base voltage would remain the same. This effectively turns the transistor off regulating the gain in that regard at a given temperature. A problem is to find the right impedance for element 27 which will give the desired output to match the opposite of the gain slope of element 42 of FIG. 4.

Figure 3A:
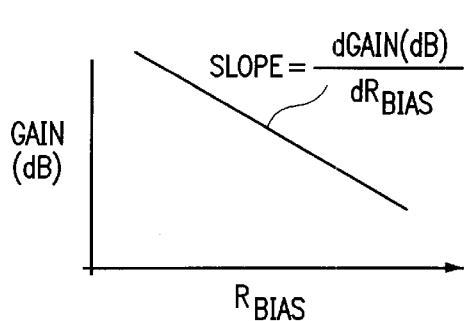
Figure 3B:
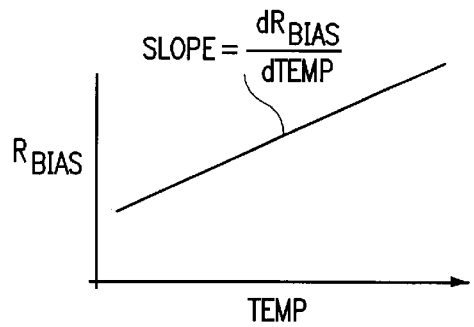

This calculation is shown in FIGS. 3A and 3B such that the gain of the IF amplifier 15 is measured as temperature is varied. In FIGS. 3A and 3B this is called the R bias and as that resistor is decreased, the gain is increased. Thus, as resistor 27's value is increased, the bias current is pinched off thereby reducing the gain so the slope of the IF amplifier of FIG. 2 is negative in FIG. 3A. FIG. 3B shows the selection of a thermistor (or any other element having a similar resistive change as a function of temperature) which will provide the desired bias resistor change as a function in temperature. When those two slopes are multiplied together, the result should be substantially equal and opposite to what the desired slope of FET 42 is.

FIG. 3C is a mathematical representation of the process used to calculate and measure these gains as a temperature function of the bias resistor.

FIG. 3D shows a circuit which results from actual measured data and the actual solution that was implemented. We know we want the slope to be equal and opposite to what we measured in FIG. 1 which was 0.059 db per degree C. Then the equation in FIG. 3C is solved for the resistance as a function of temperature. This calculation yields the resistor characteristics needed to produce a given gain change. In our example, it is 1,180.5 ohms per db. After multiplying these two together, we get 69.5 ohms per degree C which is the slope of the thermistor. We now select a resistor (or other element) with that performance. These calculations are based upon a particular circuit and, of course, different circuit parameters. For example, different differential IF amplifiers may have different characteristics and will have to be calculated in the same way.

While the embodiment shown has a single RF stage matched by a single IF stage, in fact, the same principles can apply for any set of stages. Thus, compensation for a single stage might be made by several stages or several stages might be compensated by a single stage or compensation for multiple stages can be made by multiple stages. Also note, that the compensation adjustment need not be perfect for applications, but should be within a certain range. For example, in the tuner discussed herein, the range would typically be about 8 db.

Also note that while temperature has been discussed herein as the variable against which gain has been measured, any variable could be substituted with a proper substitution of element(s) in the compensation circuit. Thus, the word temperature in the claims can also include such other variable. These other variables could be, by way of example only, light, moisture, pressure, velocity, acceleration, or a combination thereof.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A tuner circuit compensated for temperature induced gain variations, said tuner having at least one RF stage and at least one IF stage and wherein the gain of at least one of said RF stages has a certain slope with respect to temperature, said circuit comprising:

a compensation circuit connected to at least one of said IF stages, said compensation circuit having a certain slope with respect to temperature complementary to said certain slope of said RF stage such that as the temperature changes the overall gain of the tuner remains within a finite limit.

2. The tuner circuit of claim 1 wherein said certain slope of said gain of said RF stage is such that as the temperature increases the gain decreases; and wherein said certain slope of said gain of said IF stage is such that as the temperature increases the gain increases.

3. The tuner circuit of claim 1 wherein said finite limit is 2 db.

4. The tuner circuit of claim 1 wherein the tuner is a single conversion tuner.

5. The tuner circuit of claim 4 wherein said single conversion tuner has an RF stage including a dual gate FET.

6. The tuner circuit of claim 5 wherein said single conversion tuner has an IF stage including an IF amplifier connected as a differential common emitter and wherein said compensation circuit is connected to control the dc bias of said common emitter.

7. The tuner circuit of claim 6 wherein said compensation circuit includes at least one thermistor.

8. The tuner circuit of claim 1 wherein said IF stage includes an IF amplifier connected as a differential common emitter and wherein said compensation circuit is connected to control the dc bias of said common emitter.

9. The tuner circuit of claim 8 wherein said compensation circuit includes at least one thermistor.

10. The tuner circuit of claim 1 wherein said compensation circuit is a substitute for AGC with respect to temperature variations.

11. The tuner circuit of claim 1 wherein said compensation circuit includes circuitry for controlling the bias level of at least one of said IF stages.

12. A tuner circuit compensated for temperature induced gain variations, said tuner having a plurality of stages and wherein the gain of at least one of said stages has a first slope with respect to temperature, said tuner circuit comprising:
a compensation circuit connected to at least one of said stages, said compensation circuit having a second slope with respect to temperature complementary to said first slope such that as the temperature changes, the overall gain of the tuner remains within a finite limit.

13. The tuner circuit of claim 12 having at least one IF stage, said IF stage including an IF amplifier connected as a differential common emitter and wherein said compensation circuit is connected to control the dc bias of said common emitter.

14. The tuner circuit of claim 13 wherein said compensation circuit includes at least one thermistor.

15. The tuner circuit of claim 12 wherein said compensation circuit is a substitute for AGC with respect to temperature variations.

16. The tuner circuit of claim 12 wherein said compensation circuit includes circuitry for controlling the bias level of at least one of said tuner stages.

17. The method of controlling the gain of a tuner, said tuner having multiple stages, said method comprising the steps of:
measuring the gain for each stage as a function of temperature;
selecting at least one stage for controlling gain as a function of temperature where said gain has a slope complementary to said measured gain; and
calculating the value of at least one circuit element for controlling the gain in said selected stage such that said selected stage gain and said measured stage gain are within an accepted gain tolerance such that the overall tuner remains within said accepted tolerance.

18. The method of claim 17 wherein said circuit element is a thermistor and wherein said calculated value is said thermistor's impedance level as a function of temperature.

19. The method of operating a tuner, said tuner having at least one RF stage and at least one IF stage and wherein the gain of at least one of said RF stages has a certain slope with respect to temperature, said method comprising the step of:
enabling a compensation circuit, said compensation circuit connected to said at least one IF stage and having a certain slope with respect to temperature complementary to said certain slope of said at least one RF stage, so that as the temperature changes the overall gain of the tuner will remain within a finite range.

20. The method of claim 19 wherein said certain slope of said gain of said RF stage is such that as the temperature increases, the gain decreases; and wherein said certain slope of said gain of said IF stage is such that as the temperature increases the gain increases.

21. The method of claim 19 wherein said finite range is 2 db.

22. The method of claim 19 wherein the tuner is a single conversion tuner.

23. The method of claim 22 wherein said single conversion tuner has an RF stage including a dual gate FET.

24. The method of claim 23 wherein said single conversion tuner has an IF stage including an IF amplifier connected as a differential common emitter and wherein said enabling step includes the step of controlling the dc bias of said common emitter.

25. The method of claim 24 wherein said controlling step includes the use of a thermistor.

26. The method of claim 19 wherein said IF stage includes an IF amplifier connected as a differential common emitter and wherein said compensation circuit is connected to control the dc bias of said common emitter.

27. The method of claim 19 wherein said enabling step includes the step of controlling the bias level of at least one of said IF stages.

28. A tuner, said tuner comprising:
at least one RF stage and at least one IF stage and wherein the gain of at least one of said IF stages has a certain slope with respect to temperature;
means for compensating for temperature induced gain variations; and
means connected to at least one of said IF stages for maintaining the overall gain of said tuner relatively constant said means having a certain slope with respect to temperature complementary to said certain slope of said RF stage.

29. The tuner of claim 28 wherein said certain slope of said gain of said RF stage is such that as the temperature increases the gain decreases; and wherein said certain slope of said gain of said IF stage is such that as the temperature increases the gain increases.

30. The tuner of claim 28 wherein the overall gain remains within 2 db as temperature rises or falls.

31. The tuner of claim 28 wherein the tuner is a single conversion tuner.

32. The tuner of claim 31 wherein said single conversion tuner has an RF stage including a dual gate FET.

33. The tuner of claim 32 wherein said single conversion tuner has an IF stage including an IF amplifier connected as a differential common emitter and wherein said maintaining means controls the dc bias of said common emitter.

34. The tuner of claim 33 wherein said maintaining means includes at least one thermistor.

35. The tuner of claim 28 wherein said IF stage includes an IF amplifier connected as a differential common emitter and wherein said maintaining means is connected to control the dc bias of said common emitter.

36. The tuner of claim 35 wherein said maintaining means includes at least one thermistor.

37. The tuner of claim 28 wherein said maintaining means is a substitute for AGC with respect to temperature variations.

38. The tuner of claim 28 wherein said maintaining means includes circuitry for controlling the bias level of at least one of said IF stages.

* * * * *